(12) United States Patent
Lam et al.

(10) Patent No.: US 9,496,050 B2
(45) Date of Patent: Nov. 15, 2016

(54) METHODS AND APPARATUSES FOR STACKED DEVICE TESTING

(71) Applicant: Micron Technology, Inc., Boise, ID (US)

(72) Inventors: Boon Hor Lam, Boise, ID (US); Dennis Montierth, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 203 days.

(21) Appl. No.: 13/899,818

(22) Filed: May 22, 2013

(65) Prior Publication Data

US 2014/0347944 A1  Nov. 27, 2014

(51) Int. Cl.
```
G11C 7/00      (2006.01)
G11C 29/04     (2006.01)
G11C 29/26     (2006.01)
```
(52) U.S. Cl.
CPC .............. *G11C 29/04* (2013.01); *G11C 29/26* (2013.01)

(58) Field of Classification Search
USPC ........................................................ 365/201
See application file for complete search history.

(56) References Cited

U.S. PATENT DOCUMENTS

| | | | |
|---|---|---|---|
| 4,682,284 A | 7/1987 | Schrofer | |
| 4,782,487 A | 11/1988 | Smelser | |
| 4,980,888 A | 12/1990 | Bruce et al. | |
| 7,777,319 B2 | 8/2010 | Madurawe | |
| 8,127,185 B2 | 2/2012 | Jeddeloh | |
| 2005/0082667 A1* | 4/2005 | Gibson | H01L 22/32 257/734 |
| 2008/0320247 A1* | 12/2008 | Morfey | G06F 1/24 711/154 |
| 2012/0079327 A1* | 3/2012 | Vorbach | G06F 11/26 714/38.1 |
| 2013/0054871 A1* | 2/2013 | Lassa | G06F 3/061 711/103 |

\* cited by examiner

*Primary Examiner* — Huan Hoang
*Assistant Examiner* — Pablo Huerta
(74) *Attorney, Agent, or Firm* — Schwegman Lundberg & Woessner, P.A.

(57) ABSTRACT

Various embodiments include apparatus, systems, and methods having multiple dies arranged in a stack in which the dies or a logic chip in communication with the dies stores a flag for indicating whether a threshold number of cells of the dies have failed during test operations.

31 Claims, 7 Drawing Sheets

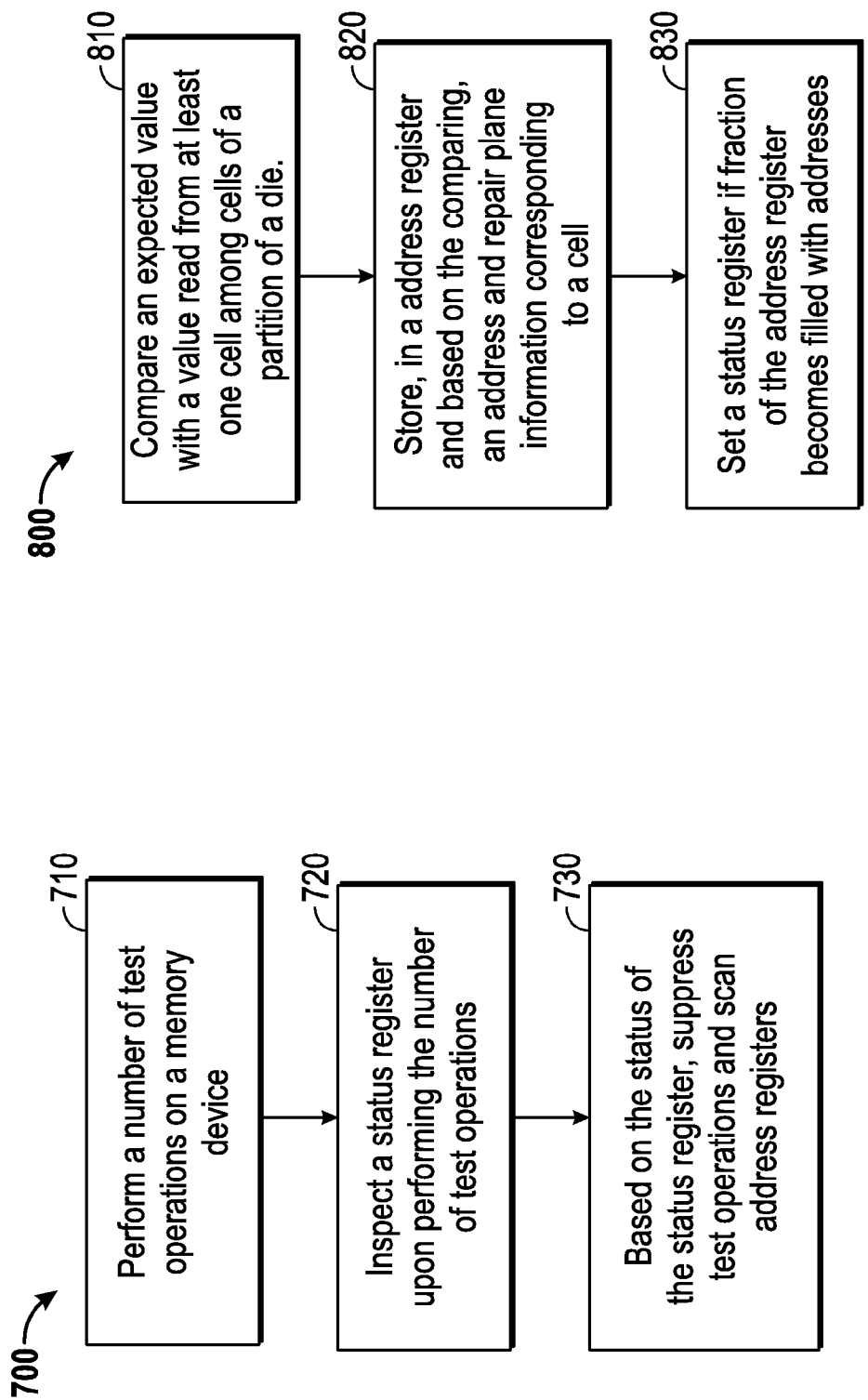

METHODS AND APPARATUSES FOR STACKED DEVICE TESTING

BACKGROUND

Computers and other electronic products, e.g., televisions, digital cameras, and cellular phones, often use memory devices having memory cells to store data and other information. A memory device usually includes a semiconductor die where memory cells are formed. Some memory devices include multiple semiconductor dies arranged in a stack. It may be time consuming to perform testing of memory devices with stacked semiconductor dies.

BRIEF DESCRIPTION OF THE DRAWINGS

FIG. 7-8 are flowcharts showing methods of testing a stacked device.

DETAILED DESCRIPTION

Figure 1:
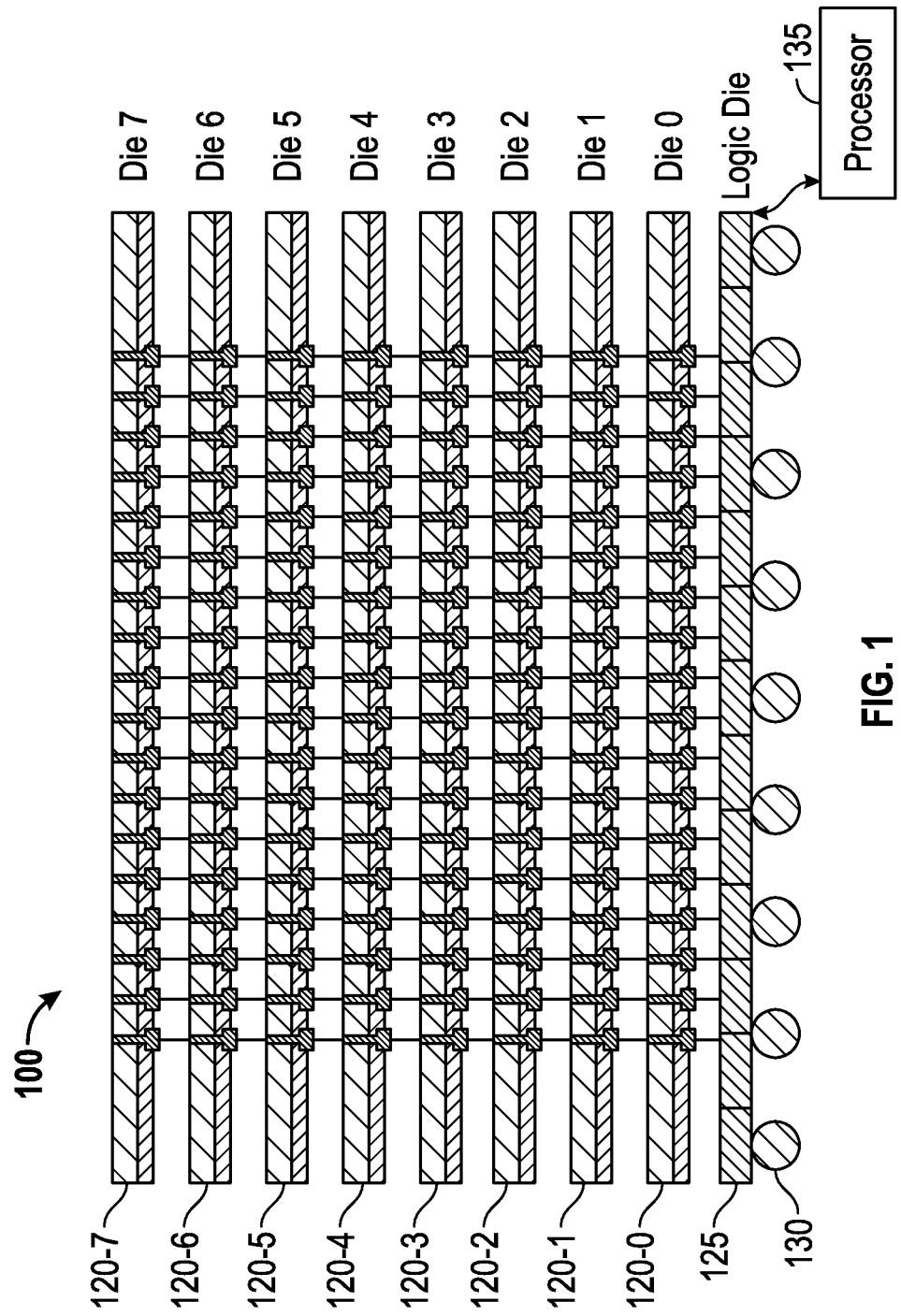
FIG. 1 is a side view of a stacked device in accordance with some embodiments.

FIG. 1 shows an IC package 100 including dies 120-0 through 120-7 of memory cells arranged in a stack in accordance with some example embodiments. The package 100 may include a logic die 125. The logic die 125 may include logic for operating the dies 120-0 through 120-7 according to requests received from the external device 135. The logic die 125 may include, for example, data buses, circuitry for performing memory controller functions, etc. The logic die 125 may be coupled to conductive elements 130 to communicate with a processor 135. The logic die 125 may be a layer of logic arranged in the stack with the plurality of memory die 120-0 through 120-7 or the logic die 125 may be laterally separated from the stack of memory dies 120-0 through 120-7, such as an ASIC mounted to the same substrate as the stack of memory die.

Figure 2:
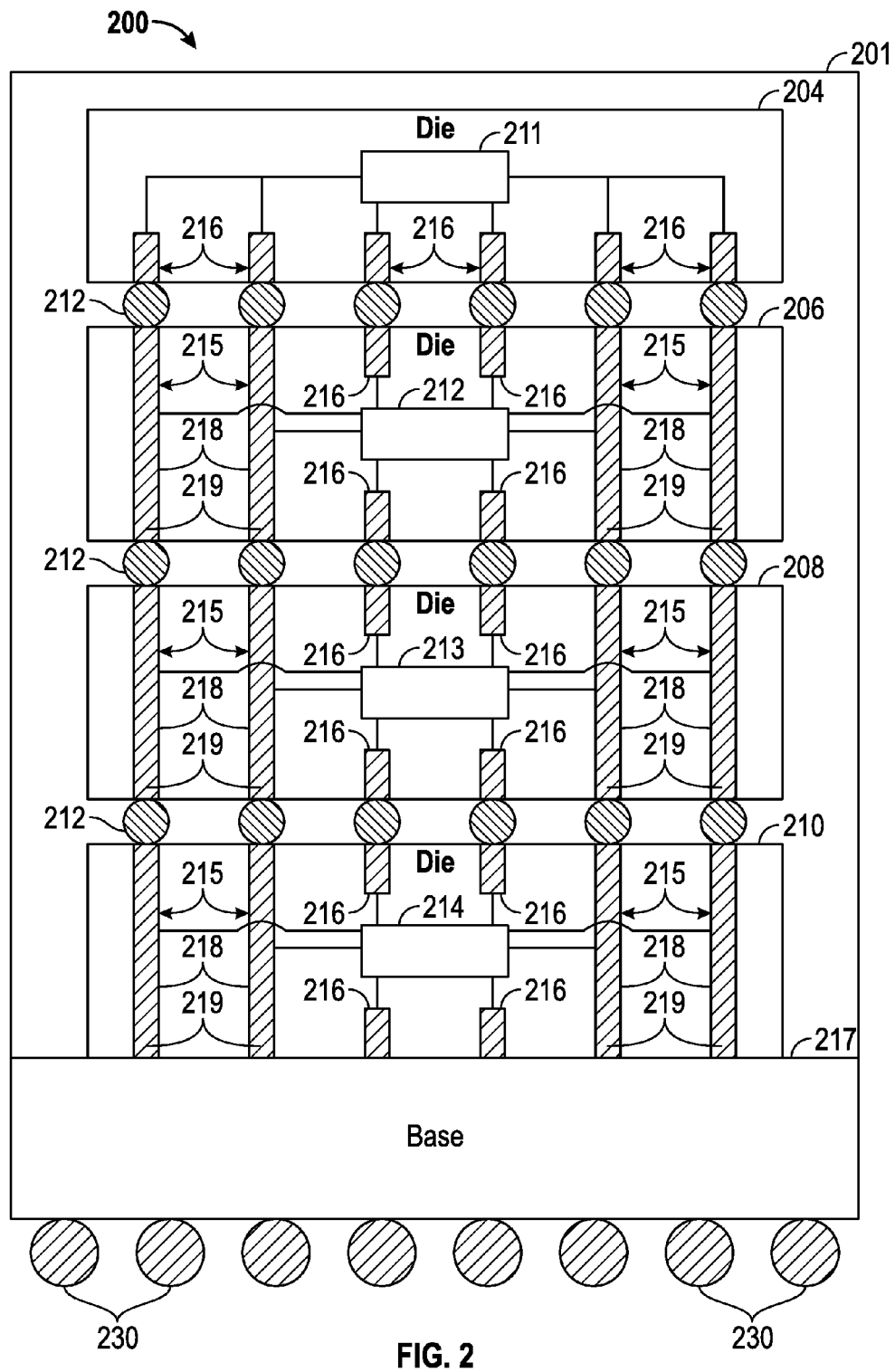
FIG. 2 is a schematic diagram showing an integrated circuit (IC) package device in accordance with some embodiments.

FIG. 2 shows a cutout view of an IC package 200 including memory dies 204, 206, 208 and a logic die 210 arranged in a stack according to various embodiments of the invention. Memory dies 204, 206 and 208 may be similar to memory dies 120-0 through 120-7. Die 210 is a logic die similar to the logic die 125 (FIG. 1). Each of dies 204, 206, 208, 210 may include circuitry 211, 212, 213, 214. One or more of circuitry 211, 212, and 213 may operate to perform storing or reading functions (e.g., functions of a memory device). One or more of circuitry 211, 212 and 213 may include two or more partitions of memory cells (not shown in FIG. 2). A partition of a memory die may be a portion of the corresponding memory die 204, 206 or 208 that corresponds to a particular vault (no shown in FIG. 2) of the stack. A vault, therefore, may include a respective partition from each of a plurality of memory die 204, 206, 208.

Each of the dies 204, 206, and 208 may include structures to perform functions of a memory device, e.g., a dynamic random access memory (DRAM) device, to store information in cells. Cells may include the same or different cell types, such as DRAM cells and static random access memory (SRAM) cells, erasable programmable read-only memory (EPROM) cells, electrically erasable programmable radon-only memory (EEPROM) cells, magnetoresistive random-access memory (MRAM) cells, or other types of memory cells The IC package 200 may include conductive paths 215 and 216 and conductive elements (e.g., solder) 212 to allow communication to and from dies 204, 206, 208 and 210. As shown in FIG. 2, some of the conductive paths (e.g., conductive paths 215) may go through the die and inside vias 218, and some other conductive paths (e.g., conductive paths 216) may only partially go into the die. Conductive paths 215 and 216 may include conductive material 219 filled inside vias 218 that are formed in the die and extended from one surface of the die to another surface of the die.

The IC package 200 may also include a base 217 and an enclosure 201 in which an interior may be filled with insulation material such as epoxy-based molding compound. Base 217 may include conductive paths (not shown in FIG. 2) coupled to conductive elements 230. The conductive paths through the base 217 may allow electrical connection, coupling, or communication between the conductive elements 230 and the dies 204, 206, 208 and 210. Base 217 may include an inorganic (e.g., ceramic) substrate or an organic substrate. FIG. 2 shows conductive elements 230 having a ball shape as an example. Conductive elements 230, however, may include other shapes such as a pin shape, rectangular shape, and others.

Among the dies, the logic die 210 may be located closest to base 217 and may provide a communication interface between IC package 200 and other external devices. FIG. 2 shows an example of an IC package 200 having four dies. However, the number of dies of the IC package 200 may vary.

Figure 3:
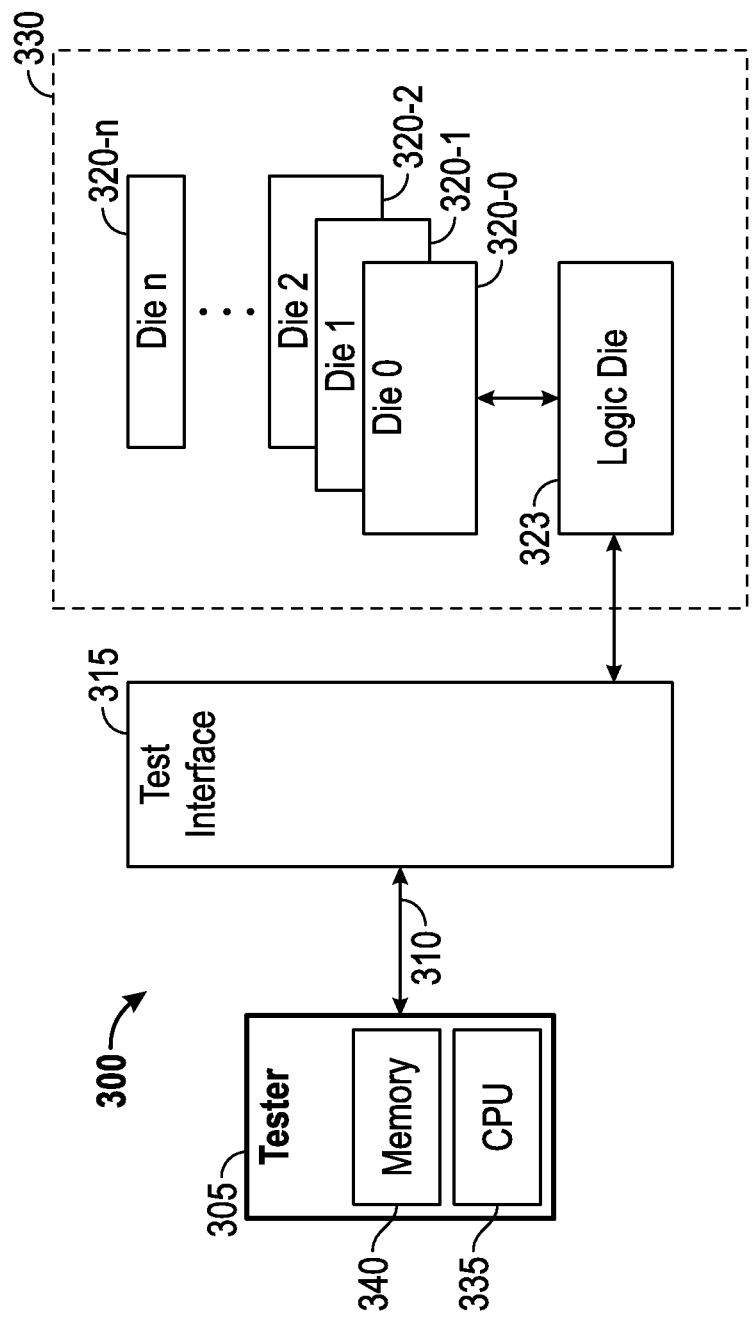
FIG. 3 is a system in which example embodiments may be implemented.

Referring to FIG. 3, a system 300 for testing a memory device 330 may include a tester 305. The memory device 330 may include two or more partitions of memory cells (not shown in FIG. 3). The tester 305 may include a computer or other device capable of sending commands and data through a test interface 315, and for receiving data from a memory device 330 through the test interface 315. The tester 305 may include a central processing unit (CPU) 335 and a memory 340. The CPU 335 may include a general-purpose processor or an application-specific integrated circuit (ASIC). The CPU 335 may execute one or more programming commands to process information or to perform methods according to example embodiments described below. The information may include information provided by one or more components of the system 300 such as the test interface 315 or the memory device 330. The memory 340 may store information related to the methods described below.

The tester 305 may connect through a connection 310 to the test interface 315. The test interface 315 may include a joint test action group (JTAG) interface in accordance with a standard of an Institute of Electrical and Electronics Engineers (IEEE) family of standards. While the test interface 315 is depicted in FIG. 3 as being outside the memory device 330, the test interface 315 could alternatively be within the memory device 330.

In a non-test mode of operation, the interface 315 may communicate with the memory dies 320-0 through 320-$n$ via the logic die 323 of the memory device 330. In a test mode of operation, the logic die 323 may be powered off and the interface 315 may communicate (e.g., directly) with the dies 320-0 through 320-n.

Some conventional memory testing systems may test a memory device by performing a series of operations on cells of the memory device. The tester may constantly scan the memory device for failures via an interface (e.g., a JTAG interface), and store the failures in a storage (e.g., in memory cells of a memory testing system computer). Such scanning may be time-consuming, at least because the interface used in the test may be a relatively slow interface.

Example embodiments described herein may reduce test time for testing a memory device 330 at least by reducing or eliminating the number of scans, for example the number of times that the JTAG interface is used to check for error conditions, of the memory device performed by the tester 305 (FIG. 3). In accordance with example embodiments, failure information, including at least the addresses and certain portions of the repair plane information of failed cells of the memory device 330, may be stored on the memory device 330. However, the fail DQ portion of the repair plane information is not found in the fail address. The failure information may be stored in address registers in the logic die 323, or the failure information may be stored in address registers of the partitions of memory cells of the dies 320-0 through 320-n as discussed below with respect to FIGS. 4 and 5. The logic die 323, or the partitions of the dies 320-0 through 320-n, may set status registers when a number of errors stored in the address registers reaches a threshold. Example embodiments described herein may also reduce time for Algorithmic Pattern Generator (APG) functionality of the logic die 323.

After the tester 305 performs some number of test operations, the tester 305 may request the contents of these status registers. The status register contents may be sent to the tester 305 to inform the tester 305 that the tester 305 should retrieve the failure information, for example failed address information, from the memory device 330. In example embodiments, therefore, the tester 305 does not constantly scan for the presence of errors, at least because the tester 305 is informed of the presence of errors based on the status of the status registers.

For example, if the status registers indicate that the tester 305 should retrieve the failure information, the tester 305 may suspend test operations and scan the stored failed addresses, by for example reading the stored failed addresses, from all the address registers of all the partitions. The tester 305 may reset the status registers and clear the address registers after pulling the failure information from the address registers.

In example embodiments, if a certain number of addresses from a same row or column of memory have failed, a respective address register may prevent new addresses from that row or column from being added to the address register. In example embodiments, then, the tester 305 does not pull address information for individual addresses, as an entire row or column may have failed. In at least these embodiments, repair mechanisms may occur on the row or column level instead of at the individual cell level.

Figure 4:
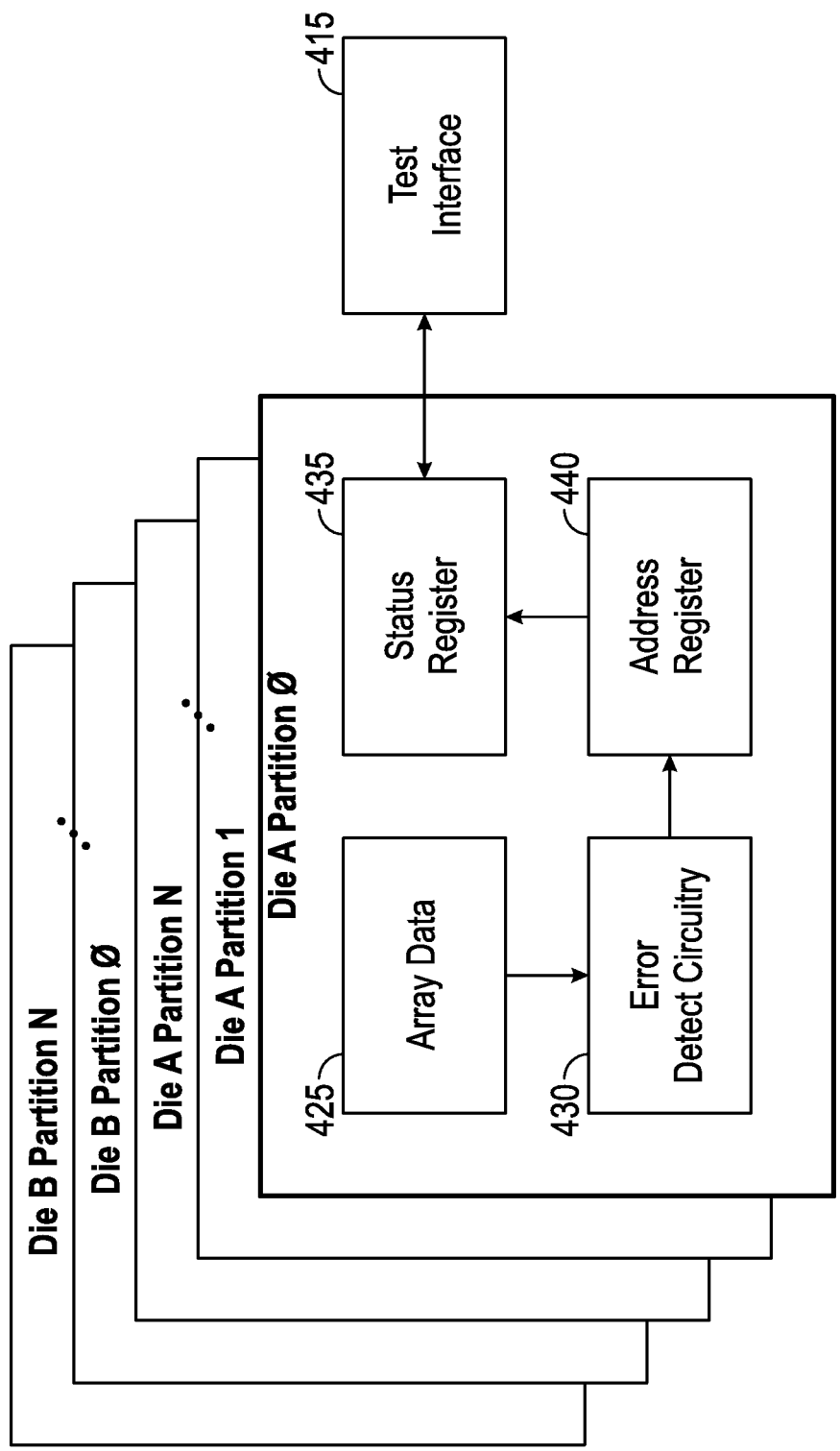
FIG. 4 is a block diagram of two or more memory partitions in accordance with some embodiments.

FIG. 4 is a block diagram of partitions of dies 320-0 through 320-n for implementing methods in accordance with some example embodiments.

Referring to FIG. 4, Die A (e.g., first die), may include partitions of cells Partition 0 through Partition N. Each of the partitions (e.g., Partition 0 of die A) may include array data 425. Each of the partitions (e.g., Partition 0 of die A) may include a status register 435. The status register 435 may indicate that a threshold number of cells of the respective partition have failed.

Each of the partitions of the Die A may further include an address register 440 to store addresses and repair plane information of the cells in the respective partition that have failed. Each of the partitions may further include a circuit 430 to detect failed cells of the respective partition. The circuit 430 may be referred to hereinafter as error detect circuitry. The circuit 430 may set a flag based on a result of a comparator circuit as described in more detail below with respect to FIG. 6.

Figure 5:
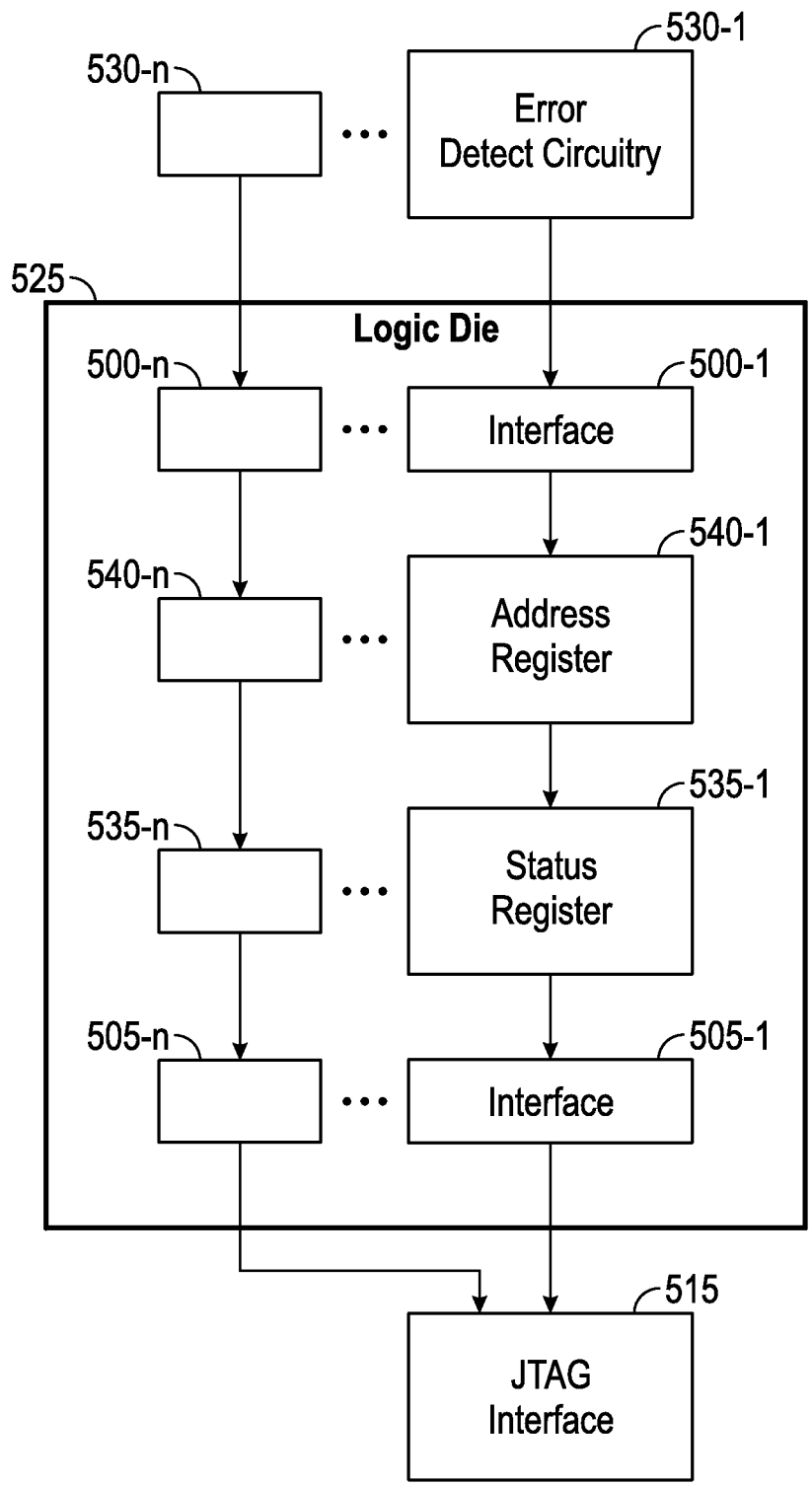
FIG. 5 is a block diagram including a logic chip of a stacked device in accordance with some embodiments.

In some example embodiments, status registers and address registers may be stored on a logic die instead of on partitions of the dies as described above with respect to FIG. 4. FIG. 5 is a block diagram including a logic die 525 for implementing methods in accordance with some example embodiments. The logic die 525 may correspond to the logic die 323 (FIG. 3). The logic die 525 may include a plurality of status registers 535-1 through 535-n that correspond to partitions of cells of one or more of the dies 120-0 through 120-n (FIG. 1), dies 204, 206 and 208 (FIG. 2) or dies 320-0 through 320-n (FIG. 3) described previously. Each of the plurality of status registers 535-1 through 535-n may indicate that a number of cells of the respective partition of cells has failed.

The logic die 525 may be arranged in a stack with the one or more dies that may correspond to dies 120-0 through 120-n (FIG. 1), 204, 206 and 208 (FIG. 2) or 320-0 through 320-n (FIG. 3). The logic die 525 may be arranged on a substrate laterally adjacent to the stack of memory dies. The logic die 525 may include one or more interfaces 500-1 through 500-n for communicating with the dies coupled to logic die 525. The interfaces 500-1 through 500-n may comprise high-speed buses, for example buses for providing data at a rate greater than 1 terabit per second.

The logic die 525 may include an interface 505-1 to provide a status of the status register to a test interface 515. The logic die 525 may include multiple interfaces (e.g., 505-1 through 505-n) to provide the status of more than one status register to the test interface 515. The interfaces 505-1 through 505-n may be configured to communicate with a JTAG interface. The logic die 525 may be configured to check the status of a status register by sending an instruction to a corresponding partition to check a corresponding register status. The logic die 525 may be configured to check the status of the status register by examining one or more check status registers stored on the logic die 525.

The logic die 525 may include a plurality of address registers 540-1 through 540-n corresponding to respective partitions of cells of the dies 120-0 through 120-n (FIG. 1), dies 204, 206 and 208 (FIG. 2) or dies 320-0 through 320-n (FIG. 3). Each of the plurality of address registers 540-1 through 540-n may store addresses of failed cells of the respective partition. The addresses may be received from error detect circuitry 530-1 through 530-n. The error detect circuitry 530-1 through 530-n may be located on dies coupled to logic die 525, such as dies 120-0 through 120-n (FIG. 1), dies 204, 206 and 208 (FIG. 2) or dies 320-0 through 320-n (FIG. 3). The logic die 525 may scan stored failed address from each of the plurality of address registers 540-1 through 540-n responsive to determining that a corresponding status register is set. A corresponding status register may be set upon a fraction of the address registers 540-1 through 540-n becoming full.

Figure 6:
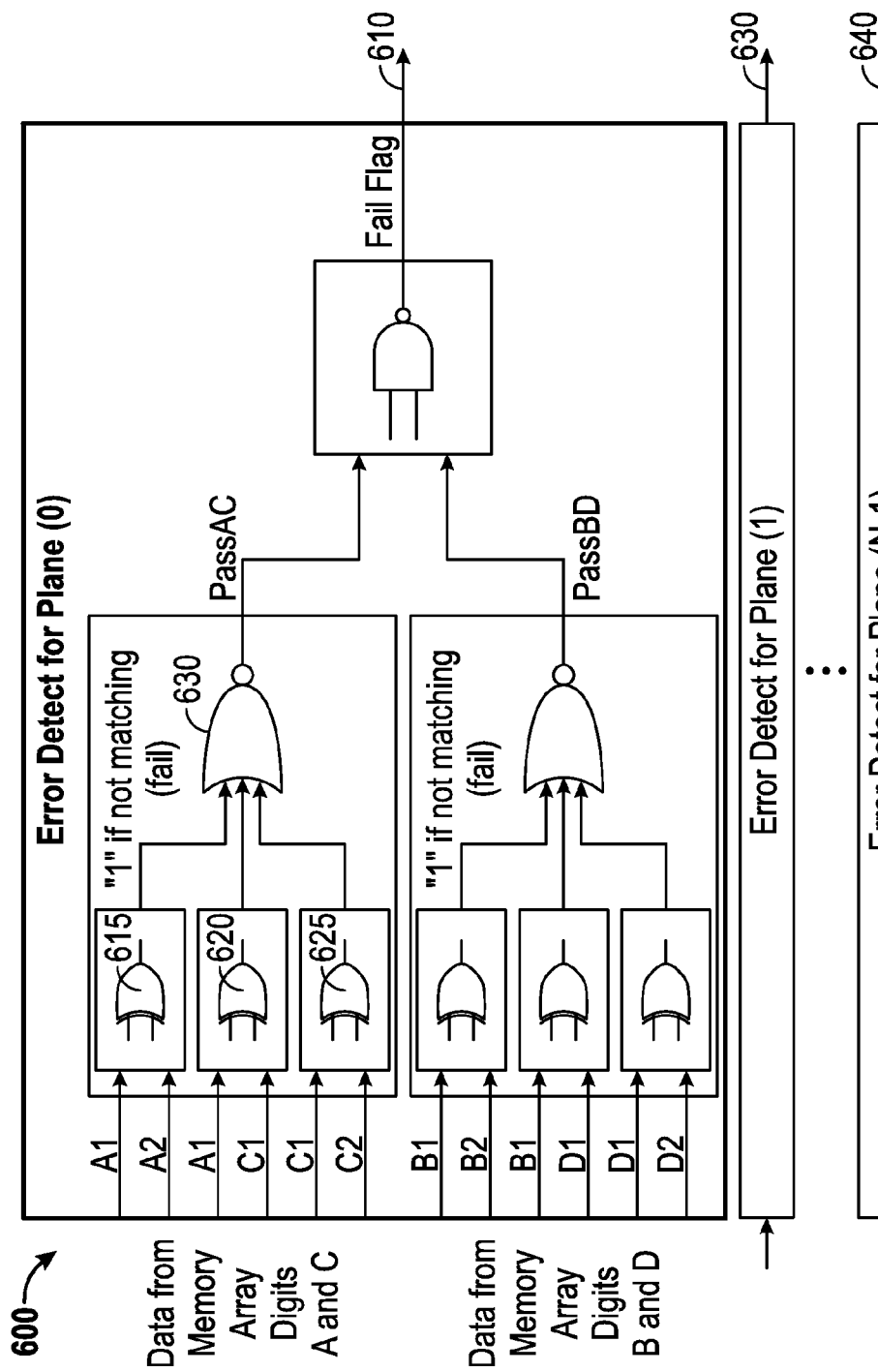
FIG. 6 is an error detect circuit in accordance with some embodiments.

FIG. 6 is a block diagram of an error detect circuitry 600 for detecting errors during a test executed by the tester 305.

The error detect circuitry 600 may be similar to the error detect circuitry 430 (FIG. 4) or the error detect circuitry 530-1 through 530-$n$ (FIG. 5).

The tester 305 may execute a test that reads data from cells of dies 120-0 through 120-$n$ (FIG. 1), 204, 206 and 208 (FIG. 2) or 320-0 through 320-$n$ (FIG. 3). The data may similar or identical to the array data 425 (FIG. 4). Data fields A1, A2, B1, B2, C1, C2, D1, and D2 may represent data in cells of dies 120-1 through 120-$n$ (FIG. 1), 204, 206 and 208 (FIG. 2) or 320-0 through 320-$n$ (FIG. 3). Based on the output 610 of the error detect circuitry 600, some cells may be found to have errors. For example, if digits A1 and A2 do not match, the exclusive-OR (XOR) gate 615 outputs a "1" or "true." Similar operations may be performed at the XOR gates 620 and 625. If any of the digits are found not to match, the not-OR gate 630 will output a "false."

FIG. 7 is a flowchart showing a method 700, performed by a tester (e.g., tester 305 of FIG. 3), for determining failed addresses of cells in a memory device (e.g., memory device 330 of FIG. 3). The method 700 may be used for testing apparatuses described above with respect to FIG. 1 through FIG. 5.

One or more of the activities of method 700 may be performed by the logic die 525. For example, one or more of the activities of method 700 may be performed by the logic die 525's Algorithmic Pattern Generator (APG) to check for failed address to generate repair solutions on memory dies.

Activity 710 of the method 700 in FIG. 7 may include performing a number of test operations on a memory device. The test operations may include read operations. The number of test operations may be based on a historical failure rate for the memory device. For example, the method 700 may include increasing or decreasing the number of test operations based on the historical failure rate for the memory device.

Activity 720 may include inspecting a status register on the memory device upon performing the number of test operations. The status register may indicate whether a threshold number of addresses in the memory device have failed. The method 700 may further include requesting the status of the status register from the memory device 330. In an example embodiment, the tester 305 may send a query to the memory device 330 to retrieve the status of the status register. In an example embodiment, the tester 305 may send the query to the memory device through a test interface (e.g., the test interface 315 of FIG. 3).

Activity 730 may include suppressing test operations and scanning address registers based on the status of the status register. The address registers may store addresses and repair plane information of cells of the memory device that failed during the number of test operations. In an example embodiment, the status register may be "set" (i.e., assigned a value of "1") if a fraction (e.g., a predetermined fraction) of the address registers of a repair plane are filled with addresses of failed cells. The number of test operations performed may correlate statistically to the least amount of time when the address registers is likely to be filled by addresses of failed cells. This statistic may correspond to the historical failure rate of the memory device or of similar memory devices.

The method 700 may further include increasing or decreasing the number of test operations upon determining that the address registers includes more or less than a threshold number of addresses. The status registers and the address registers may be located on either or both of the first die or the second die. The first die and the second die may be one of dies 320-0 through 320-$n$ (FIG. 3). The status registers and the address registers may be located on the logic die of the memory device 330.

The method 700 may further include, subsequent to the scanning, storing the contents of the address registers and resuming test operations.

FIG. 8 is a flowchart showing a method 800, performed for example by components of a memory device 330 (FIG. 3), for indicating error conditions of memory cells during a test operation or a number of test operations. The method may be performed by one or more components of an IC package and stacked memory device that are similar to or identical to IC packages 100 and 200, and apparatuses described above with respect to FIG. 1 through FIG. 6.

Activity 810 may include comparing an expected value with a value read from at least one cell among cells of a partition of a die. Activity 810 may be performed by, for example, error detect circuitry 430 (FIG. 4).

Activity 820 may include storing an address and repair plane information corresponding to a cell. The address may be stored in an address register, based on the comparison of activity 810. The cell may be a cell that has failed a test operation or that was found to fail during normal operation.

Activity 830 may include setting a status register if a fraction of the address register becomes filled with addresses. The method may further include receiving a request for the status of the status register. The method may further include sending the status of the status register to an output node based on the request. The status register may operate similarly to the status registers and address registers described above with respect to FIGS. 4 and 5.

The illustrations of apparatuses discussed above regarding FIG. 1 through 9 are intended to provide a general understanding of the structure of various embodiments and are not intended to provide a complete description of all the components and features of apparatus that might make use of the structures described herein.

Any of the components described above can be implemented in a number of ways, including simulation via software. Thus, apparatuses described above may be characterized as "modules" (or "module") herein. Such modules may include hardware circuitry, single and/or multi-processor circuits, memory circuits, software program modules and objects and/or firmware, and combinations thereof, as desired by the architect of the apparatus and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatuses of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatuses may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

One or more embodiments described herein include apparatuses and methods for performing test operations on dies of memory cells.

The dies of memory cells may be arranged in a stack. Other embodiments including additional apparatuses and methods are described above with reference to FIG. 1 through FIG. 8.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of other embodiments. Many other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the claims.

What is claimed is:

1. An apparatus comprising a logic die coupled with a plurality of memory dies, wherein the apparatus includes:
    a plurality of address registers, each corresponding to a partition of a particular memory die of the plurality of memory dies, wherein each of the plurality of address registers is configured to store a respective failed address and repair plane information of the particular memory die; and
    a plurality of status registers, each corresponding to one of the plurality of address registers, wherein the status registers are configured to be set when a total number of failed addresses stored in the address registers reaches a threshold, and wherein the logic die is configured to inform an external test apparatus to suspend test operations and to scan the stored failed addresses responsive to determining that the status registers are set.

2. The apparatus of claim 1, wherein the plurality of memory dies are arranged in a stack.

3. The apparatus of claim 2, wherein the logic die is arranged in the stack with the plurality of memory dies.

4. The apparatus of claim 2, wherein the logic die is arranged on a substrate laterally adjacent to the stack of memory dies.

5. The apparatus of claim 1, wherein the plurality of address registers are located on the particular memory die.

6. The apparatus of claim 1, wherein the plurality of address registers are located on the logic die.

7. The apparatus of claim 1, wherein
    the apparatus includes error detection circuitry coupled to the plurality of address registers, and
    the error detect circuitry is configured to
        detect whether an address of the particular memory die is failing and, responsive to detecting that a particular address of the particular memory die is failing, to cause the particular address to be stored in an address register of the plurality of address registers as a failed address.

8. The apparatus of claim 1, wherein the logic die is configured to check the status of the status register.

9. The apparatus of claim 8, wherein the logic die is configured to check the status of one or more of the plurality of status registers by sending an instruction to a corresponding partition to check a corresponding register status.

10. The apparatus of claim 8, wherein the logic die is configured to check the status of one or more of the plurality of status registers by examining one or more check status registers stored on the logic die.

11. The apparatus of claim 1, wherein the logic die is configured to suspend read operations responsive to determining that the status register is set.

12. The apparatus of claim 1, wherein
    the plurality of address registers includes a first plurality of address registers,
    the apparatus further includes a second plurality of address registers corresponding to another partition of the plurality of memory dies, and
    the logic die is configured to
        scan stored failed addresses from the first and second plurality of address registers responsive to determining that a corresponding status register is set, and
        generate a repair solution based, at least in part, on at least a portion of the scanned failed addresses.

13. The apparatus of claim 1, wherein the apparatus is configured to allow an external test to check the status of the status register.

14. A system comprising:
    a computing device configured to perform operations on a memory device, the memory device coupled to the computing device, the memory device including
        a plurality of memory dies;
        a logic chip coupled to the plurality of memory dies; and
        a plurality of status registers configured to be set responsive to failure of a fraction of the cells, wherein the plurality of status registers are located on the plurality of memory dies, and the plurality of memory dies further include a plurality of address registers corresponding to the plurality of the status registers for storing addresses and repair plane information of failed addresses, and wherein the plurality of the status registers are configured to be set when a total number of the failed addresses stored in the address registers reaches a threshold, and wherein the logic chip is configured to inform the computing device to suspend test operations and to scan the stored failed addresses responsive to determining that the status registers are set.

15. The system of claim 14, further comprising a test interface connected between the computing device and the memory device.

16. The system of claim 15, wherein the test interface includes a joint test action group (JTAG) interface according to a standard of an Institute of Electrical and Electronics Engineers (IEEE) family of standards.

17. The system of claim 14, wherein the status registers are stored on the logic chip.

18. The system of claim 17, wherein the logic chip further comprises address registers for storing addresses and repair plane information of cells that have failed during the operation.

19. A method comprising:
    performing a number of test operations on a memory device;

inspecting a status register on the memory device upon performing the number of test operations, the status register indicating that a number of cells in the memory device have failed;

suppressing test operations and scanning address registers of the memory device, the address registers each storing addresses of the cells of a corresponding partition of the memory device that failed during the test operations, based on the inspection of the status register, wherein the status register is configured to be set when a total number of the failed addresses stored in the address registers reaches a threshold, and wherein a logic chip of the memory device is configured to inform an external testing device to suspend the test operations and to scan the stored failed addresses responsive to determining that the status register is set.

20. The method of claim 19, further comprising:
requesting a status of the status register from the memory device.

21. The method of claim 19, further comprising, subsequent to the scanning:
storing contents of the address registers; and
performing a second number of test operations.

22. The method of claim 19, wherein the test operations are performed on a first die and a second die, the first die and the second die being arranged in a stack, the first die including memory cells, and the second die including memory cells.

23. The method of claim 19, wherein the number of test operations is based on a historical failure rate for the memory device.

24. The method of claim 19, further comprising:
reducing the number of test operations to be performed in subsequent numbers of test operations if the number of addresses exceeds a value.

25. The method of claim 19, further comprising:
increasing the number of test operations to be performed in subsequent number of test operations if the number of addresses is below a value.

26. The method of claim 19, wherein the test operation is a read operation.

27. A method comprising:
comparing an expected value with a value read from at least one cell among cells of a partition of a die;
storing, in an address register of address registers on the memory device including the die, a failed address and repair plane information corresponding to the cell if comparing determines that the value read from the cell does not match the expected value;
setting a status register when a total number of failed addresses stored in the address registers reaches a threshold; and
informing an external testing device to suspend test operations and scanning the stored failed addresses responsive to determining that the status register is set.

28. The method of claim 27, further comprising:
receiving a request for the status of the status register; and
sending the status of the status register to an output node based on the request.

29. A method, performed by a logic die, for detecting failed memory cells in a memory system including a plurality of memory dies and the logic die, the method comprising:
inspecting a plurality of status registers, the plurality of status registers indicating that a number of cells in a corresponding memory die of the plurality of memory dies have failed; and
scanning address registers of the memory device corresponding the status registers based on the inspecting, the address registers storing addresses of the cells of the memory system that failed,
wherein the status registers are configured to be set when a total number of the failed addresses stored in the address registers reaches a threshold, and wherein a logic chip of the memory device is configured to inform an external testing device to suspend the test operations and to scan the stored failed addresses responsive to determining that the status registers are set.

30. The method of claim 29, wherein the logic die inspects the status register stored on the logic die.

31. The method of claim 29, wherein the logic die sends a message to one or more of the plurality of memory dies to request contents of the status register.

* * * * *